(12) United States Patent
Sato et al.

(10) Patent No.: US 10,454,434 B2
(45) Date of Patent: Oct. 22, 2019

(54) COMMUNICATION UNIT

(71) Applicant: Murata Manufacturing Co., Ltd., Kyoto (JP)

(72) Inventors: Tsuyoshi Sato, Kyoto (JP); Hidetoshi Matsumoto, Kyoto (JP); Kiichiro Takenaka, Kyoto (JP); Masahiro Ito, Kyoto (JP); Satoshi Tanaka, Kyoto (JP); Takahiro Katamata, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/038,770

(22) Filed: Jul. 18, 2018

(65) Prior Publication Data

US 2019/0028074 A1 Jan. 24, 2019

(30) Foreign Application Priority Data

Jul. 21, 2017 (JP) .................................. 2017-141620
Apr. 19, 2018 (JP) .................................. 2018-080612

(51) Int. Cl.
| | | |
|---|---|---|
| H03F 3/24 | (2006.01) | |
| H03F 3/21 | (2006.01) | |
| H03F 3/45 | (2006.01) | |
| H03F 3/195 | (2006.01) | |

(52) U.S. Cl.
CPC ............. *H03F 3/245* (2013.01); *H03F 3/195* (2013.01); *H03F 3/211* (2013.01); *H03F 3/4508* (2013.01); *H03F 2200/294* (2013.01)

(58) Field of Classification Search
None
See application file for complete search history.

(56) References Cited

U.S. PATENT DOCUMENTS

| | | | | |
|---|---|---|---|---|
| 5,768,691 A | * | 6/1998 | Matero .................... | H01Q 1/24 333/101 |
| 5,794,159 A | * | 8/1998 | Portin .................... | H04B 1/005 361/814 |
| 6,560,443 B1 | * | 5/2003 | Vaisanen .................. | H01Q 3/24 455/553.1 |

(Continued)

FOREIGN PATENT DOCUMENTS

JP        2001-024579 A       1/2001

*Primary Examiner* — Lana N Le
(74) *Attorney, Agent, or Firm* — Pearne & Gordon LLP

(57) ABSTRACT

A communication unit includes a first input terminal to which a first transmission signal based on a first communication standard is input, a second input terminal to which a second transmission signal based on a second communication standard is input, a first transmission signal amplifier circuit outputting a first amplified transmission signal, or outputting a second amplified transmission signal, a first input-output terminal outputting the first amplified transmission signal or the second amplified transmission signal, and at least one of a first reception signal and a second reception signal inputted to the first input-output terminal, a first reception signal amplifier circuit performing at least one of operation of outputting a first amplified reception signal and operation of outputting a second amplified reception signal, a first output terminal outputting the first amplified reception signal, and a second output terminal outputting the second amplified reception signal.

3 Claims, 13 Drawing Sheets

(56) References Cited

U.S. PATENT DOCUMENTS

| | | | | |
|---|---|---|---|---|
| 7,546,107 | B2 * | 6/2009 | Noda | H04B 1/126 |
| | | | | 455/283 |
| 7,636,554 | B2 * | 12/2009 | Sugar | H04B 1/005 |
| | | | | 455/272 |
| 2007/0098047 | A1 * | 5/2007 | Iida | H04B 15/02 |
| | | | | 375/141 |
| 2010/0062727 | A1 * | 3/2010 | Kemmochi | H04B 1/44 |
| | | | | 455/74 |
| 2011/0319042 | A1 * | 12/2011 | Soman | H04B 1/18 |
| | | | | 455/205 |
| 2012/0113874 | A1 * | 5/2012 | Sanguinetti | H04B 1/525 |
| | | | | 370/277 |
| 2012/0235734 | A1 * | 9/2012 | Pengelly | H03F 1/0288 |
| | | | | 330/124 D |
| 2013/0201881 | A1 * | 8/2013 | Bauder | H03H 7/48 |
| | | | | 370/277 |
| 2014/0118065 | A1 * | 5/2014 | Briffa | H03F 1/025 |
| | | | | 330/129 |
| 2016/0352373 | A1 * | 12/2016 | Wloczysiak | H04B 1/10 |
| 2017/0302317 | A1 * | 10/2017 | Horita | H04B 1/00 |
| 2017/0346452 | A1 * | 11/2017 | Wada | H03H 7/075 |
| 2018/0019731 | A1 * | 1/2018 | Tsukamoto | H03H 9/0009 |
| 2018/0226928 | A1 * | 8/2018 | Obiya | H04B 1/00 |
| 2019/0081611 | A1 * | 3/2019 | Vetury | H03H 9/17 |

* cited by examiner

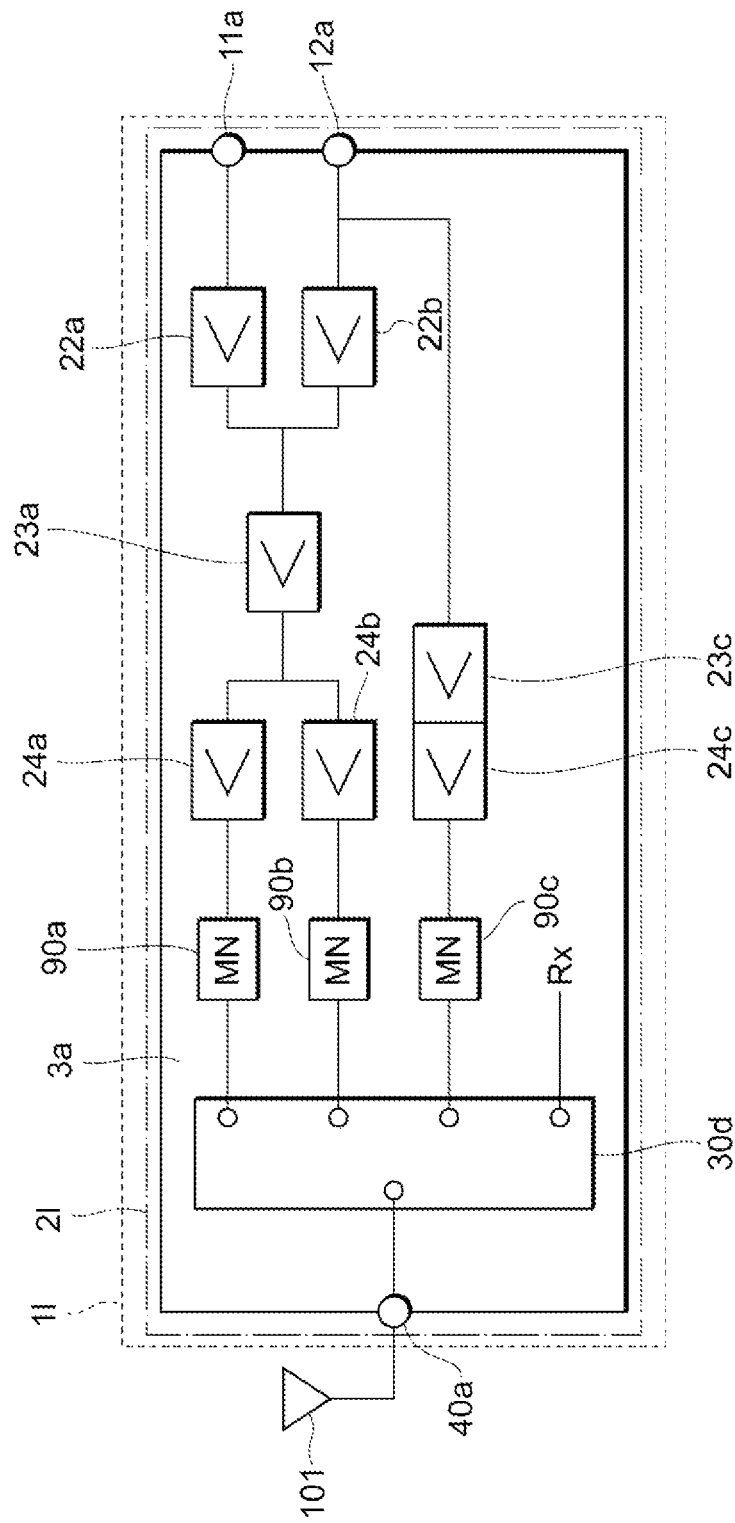

COMMUNICATION UNIT

This application claims priority from Japanese Patent Application No. 2018-080612 filed on Apr. 19, 2018, and claims priority from Japanese Patent Application No. 2017-141620 filed on Jul. 21, 2017. The contents of these applications are incorporated herein by reference in their entireties.

BACKGROUND

The present disclosure relates to a communication unit. Currently, manufacturers that manufacture portable terminals or components of the portable terminals are faced with the necessity of relieving communication congestion caused by portable terminal users having increased explosively. For this reason, in many cases, current portable terminals are designed so that communication congestion can be avoided by using a cellular phone system and a wireless local area network (LAN) system appropriately to achieve stable communication.

For example, Japanese Unexamined Patent Application Publication No. 2001-24579 discloses a mobile terminal including a first transceiver supporting wireless LAN signals and a second transceiver supporting Bluetooth (registered trademark) signals.

In recent years, studies have been made for the practical use of enhanced licensed assisted access (eLAA) in which a long term evolution (LTE) signal is used in a license-free (unlicensed) frequency band. However, for example, as in the mobile terminal disclosed in Japanese Unexamined Patent Application Publication No. 2001-24579, separate installation of a transceiver supporting eLAA in addition to a transceiver supporting a wireless LAN results in an increase in circuit size.

BRIEF SUMMARY

The present disclosure has been made in consideration of such circumstances to provide a communication unit that makes it possible to curb an increase in circuit size while achieving communications based on communication standards different from each other.

A communication unit according to one embodiment of the present disclosure includes a first communication module including: a first input terminal to which a first transmission signal based on a first communication standard is input; a second input terminal to which a second transmission signal based on a second communication standard different from the first communication standard is input; a first transmission signal amplifier circuit that performs operation of outputting a first amplified transmission signal obtained by amplifying the first transmission signal, or operation of outputting a second amplified transmission signal obtained by amplifying the second transmission signal; a first input-output terminal that outputs the first amplified transmission signal or the second amplified transmission signal and to which at least one of a first reception signal based on the first communication standard and a second reception signal based on the second communication standard is input; a first reception signal amplifier circuit that performs at least one of operation of outputting a first amplified reception signal obtained by amplifying the first reception signal and operation of outputting a second amplified reception signal obtained by amplifying the second reception signal; a first output terminal that outputs the first amplified reception signal; and a second output terminal that outputs the second amplified reception signal.

Embodiments of the present disclosure can provide the communication unit that makes it possible to curb an increase in circuit size while achieving communications based on communication standards different from each other.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 9B illustrates an example of a circuit configuration of a communication unit according to a modification of the ninth embodiment.

DETAILED DESCRIPTION

Figure 1:
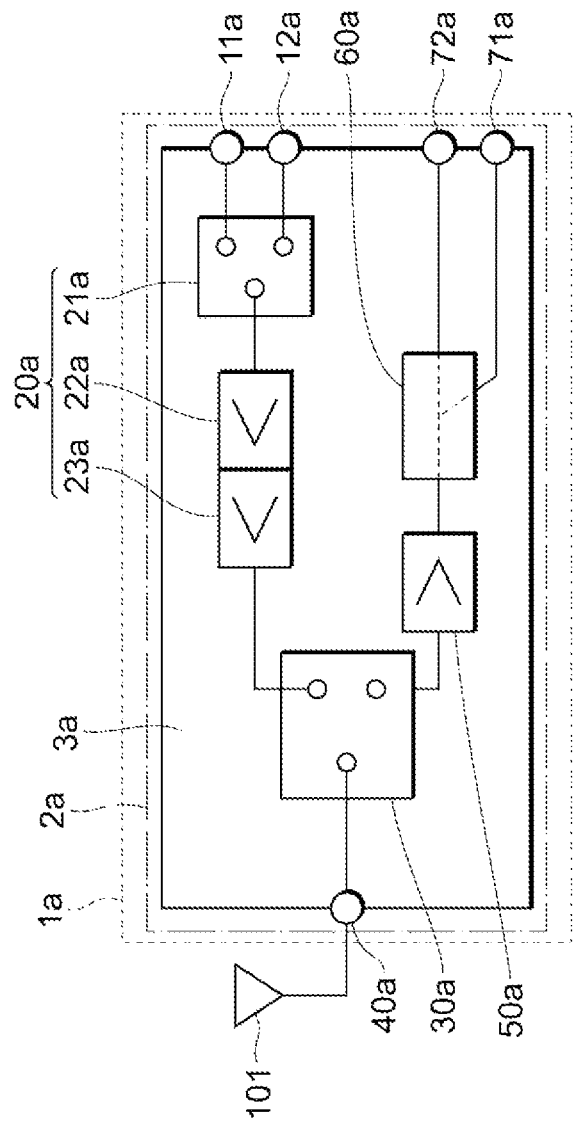
FIG. 1 illustrates an example of a circuit configuration of a communication unit according to a first embodiment.

Embodiments of the present disclosure will be described with reference to the accompanying drawing. In figures, elements denoted by the same reference numerals have the same or similar configuration.

First Embodiment

A communication unit $1a$ according to a first embodiment will be described with reference to FIG. 1.

FIG. 1 illustrates an example of a circuit configuration of the communication unit according to the first embodiment. The communication unit $1a$ is included in, for example, a portable terminal, and is used for transmitting and receiving data, such as voice, images, and videos, to and from a base station. The communication unit $1a$ supports, for example, radio frequency (RF) signals based on respective different communication standards in the same frequency band. Specifically, the communication unit 1a supports enhanced licensed assisted access (eLAA) and a wireless local area network (LAN).

The communication unit 1a includes a communication module 2a (first communication module) as illustrated in FIG. 1. The communication module 2a includes a substrate 3a, and an input terminal 11a, an input terminal 12a, a transmission signal amplifier circuit 20a, an input-output changing switch 30a, an input-output terminal 40a, a reception signal amplifier circuit 50a, a divider 60a, an output terminal 71a, and an output terminal 72a that are disposed on the substrate 3a. Furthermore, although not illustrated, a control integrated circuit (IC) that controls the communication unit 1a is mounted on the substrate 3a, and may communicate with, for example, radio frequency integrated circuits (RFICs) conforming to the respective communication standards.

A transmission signal (first transmission signal) based on a first communication standard is input to the input terminal 11a (first input terminal). The first communication standard herein refers to eLAA in which communication is performed using a long term evolution (LTE) system in a 5 GHz band, for example. A transmission signal (second transmission signal) based on a second communication standard different from the first communication standard is input to the input terminal 12a (second input terminal). The second communication standard herein refers to a wireless LAN using a 5 GHz band, for example. That is, frequency bands used in the first communication standard and the second communication standard coincide with each other.

The transmission signal amplifier circuit 20a (first transmission signal amplifier circuit) includes a switch 21a, and amplifiers 22a and 23a. The amplifiers 22a and 23a are power amplifiers, for example. The amplifiers 22a and 23a, and the switch 21a may be composed of transistors (including a bipolar transistor and a field-effect transistor (FET)) made of a compound semiconductor, such as gallium arsenide (GaAs) or silicon germanium (SiGe), or may be composed of transistors (including a bipolar transistor and a FET) made of a single crystal semiconductor, such as Si or silicon on insulator (SOI). As long as the amplifiers 22a and 23a and the switch 21a are made of the same semiconductor, the amplifiers 22a and 23a and the switch 21a may be integrated into a single chip or may be separated.

The switch 21a switches between a state in which an input of the amplifier 22a and the input terminal 11a are electrically connected to each other and a state in which the input of the amplifier 22a and the input terminal 12a are electrically connected to each other. Thus, the switch 21a switches between the case where a transmission signal input to the input terminal 11a is input to the amplifier 22a and the case where a transmission signal input to the input terminal 12a is input to the amplifier 22a. The amplifiers 22a and 23a perform operation of outputting an amplified transmission signal (first amplified transmission signal) obtained by amplifying a transmission signal based on the first communication standard, or operation of outputting an amplified transmission signal (second amplified transmission signal) obtained by amplifying a transmission signal based on the second communication standard.

The input-output changing switch 30a switches between a state in which an output of the amplifier 23a and the input-output terminal 40a are electrically connected to each other and a state in which an input of the reception signal amplifier circuit 50a and the input-output terminal 40a are electrically connected to each other. Thus, the input-output changing switch 30a switches between the case where an amplified transmission signal output from the amplifier 23a is output from the input-output terminal 40a and the case where a reception signal received at the input-output terminal 40a is input to the reception signal amplifier circuit 50a. As a result, the communication module 2a puts communication based on the second communication standard into an idle state and performs uplink communication based on the first communication standard, or puts communication based on the first communication standard into an idle state and performs uplink communication based on the second communication standard. Like the switch 21a, the input-output changing switch 30a may be composed of a transistor made of a compound semiconductor, such as GaAs or SiGe, or may be composed of a transistor made of a single crystal semiconductor, such as Si or SOI. The input-output changing switch 30a and the switch 21a may be integrated into a single chip or may be separated.

The input-output terminal 40a (first input-output terminal) outputs an amplified transmission signal based on the first communication standard or the second communication standard, and a reception signal based on the first communication standard or the second communication standard is input to the input-output terminal 40a. The input-output terminal 40a is electrically connected to an antenna 101 and transmits the amplified transmission signal and receives the reception signal via the antenna 101.

The reception signal amplifier circuit 50a (first reception signal amplifier circuit) outputs an amplified reception signal obtained by amplifying a reception signal based on the first communication standard or the second communication standard. The reception signal amplifier circuit 50a is a low noise amplifier, for example. Like the switch 21a, the reception signal amplifier circuit 50a may be composed of a transistor made of a compound semiconductor, such as GaAs or SiGe, or may be composed of a transistor made of a single crystal semiconductor, such as Si or SOI. The input-output changing switch 30a and the reception signal amplifier circuit 50a may be integrated into a single chip or may be separated.

The divider 60a divides an amplified reception signal output by the reception signal amplifier circuit 50a into two signals to output the two signals.

For example, in the case where downlink communication based on the first communication standard is being performed, the reception signal amplifier circuit 50a outputs an amplified reception signal (first amplified reception signal) obtained by amplifying a reception signal (first reception signal) based on the first communication standard. In this case, the divider 60a divides the amplified reception signal into two signals and outputs the two signals to the output terminal 71a (first output terminal) and the output terminal 72a (second output terminal) respectively. Furthermore, for example, in the case where downlink communication based on the second communication standard is being performed, the reception signal amplifier circuit 50a outputs an amplified reception signal (second amplified reception signal) obtained by amplifying a reception signal (second reception signal) based on the second communication standard. In this case, the divider 60a divides the amplified reception signal into two signals and outputs the two signals to the output terminal 71a and the output terminal 72a respectively. Furthermore, for example, in the case where downlink communication based on the first communication standard and downlink communication based on the second communication standard are being performed simultaneously, the reception signal amplifier circuit 50a outputs an amplified reception signal based on the first communication standard and an amplified reception signal based on the second communication standard. In this case, the divider 60a divides each of the amplified reception signal based on the first communication standard and the amplified reception signal based on the second communication standard into two signals and outputs the two signals to the output terminal 71a and the output terminal 72a respectively.

As just described, in the communication unit 1a, transmission signals based on different communication standards are amplified by the one transmission signal amplifier circuit 20a, and reception signals based on the different communication standards are amplified by the one reception signal amplifier circuit 50a. Thus, in comparison with a configuration (hereinafter also referred to as "comparative example") in which a combination of a transmission circuit and a reception circuit is provided for each communication standard as disclosed in, for example, Japanese Unexamined Patent Application Publication No. 2001-24579 described above, the communication unit 1a makes it possible to achieve communications based on communication standards different from each other while curbing an increase in circuit size.

Any or all of the transmission signal amplifier circuit 20a, the reception signal amplifier circuit 50a, and the control IC (not illustrated) may be integrated into a single chip or may be separated. The case where any or all of them are integrated into a single chip makes it possible to achieve a reduction in the size of the module. On the other hand, in comparison with the case where any or all of them are integrated into a single chip, the case where any or all of them are separated into a plurality of chips makes it possible to physically separate a transmission signal and a reception signal from each other and reduce a deterioration in reception sensitivity, for example.

Second Embodiment

Figure 2:
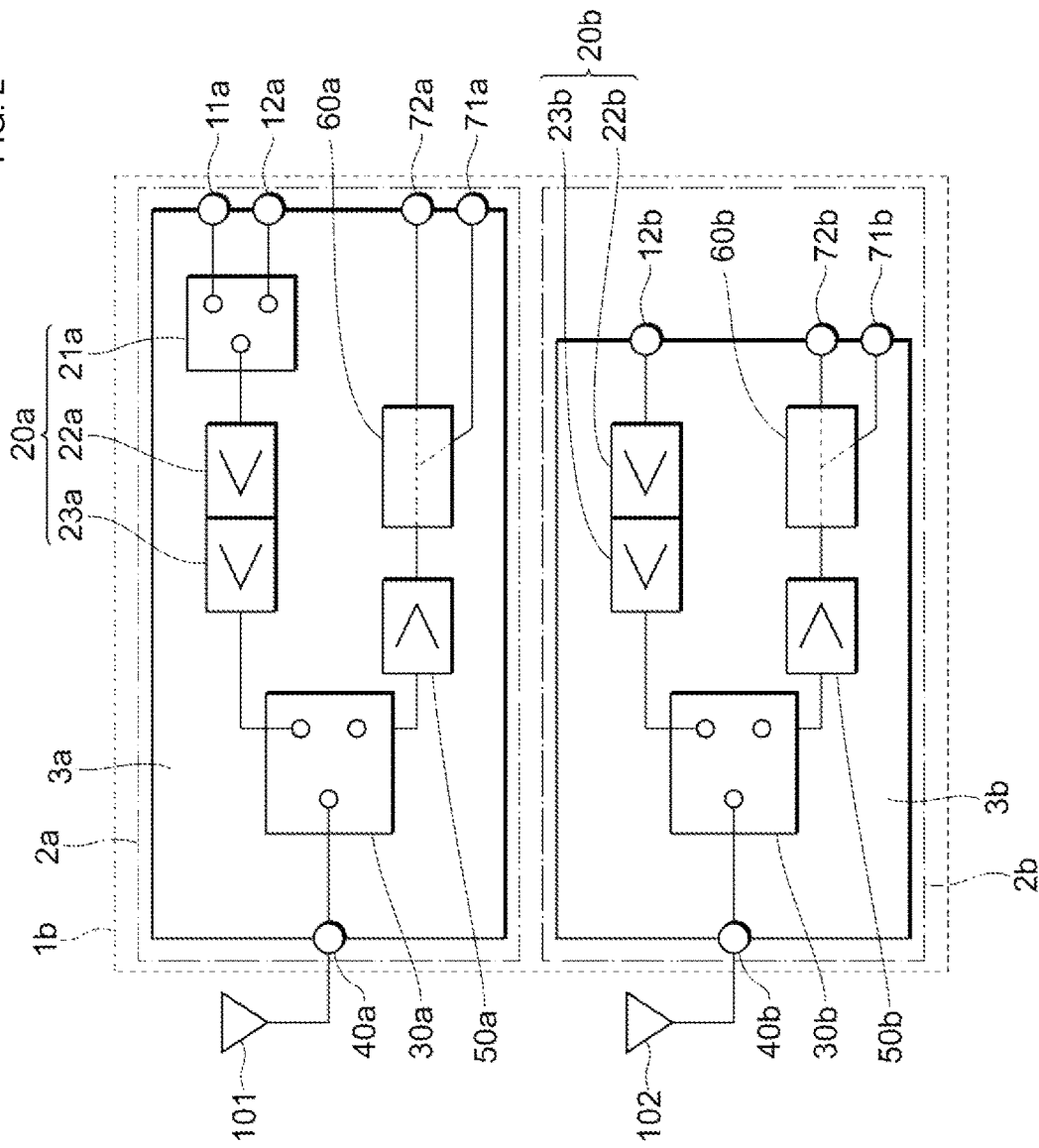
FIG. 2 illustrates an example of a circuit configuration of a communication unit according to a second embodiment.

A communication unit 1b according to a second embodiment will be described with reference to FIG. 2. In the second and subsequent embodiments, descriptions of things common to the foregoing embodiment are omitted, and only respects in which the second and subsequent embodiments differ from the foregoing embodiment will be described. FIG. 2 illustrates an example of a circuit configuration of the communication unit according to the second embodiment.

As illustrated in FIG. 2, the communication unit 1b includes a communication module 2b in addition to the communication module 2a according to the first embodiment. The communication module 2b (second communication module) supports uplink communication based on the second communication standard and supports downlink communication based on the first communication standard and downlink communication based on the second communication standard. Specifically, the communication module 2b includes a substrate 3b, and an input terminal 12b (third input terminal), a transmission signal amplifier circuit 20b (second transmission signal amplifier circuit), an input-output changing switch 30b, an input-output terminal 40b (second input-output terminal), a reception signal amplifier circuit 50b (second reception signal amplifier circuit), a divider 60b, an output terminal 71b (third output terminal), and an output terminal 72b (fourth output terminal) that are disposed on the substrate 3b. The communication module 2b differs from the communication module 2a in that the communication module 2b does not include elements corresponding to the input terminal 11a and the switch 21a. The input-output terminal 40b is electrically connected to an antenna 102 and transmits the amplified transmission signal and receives the reception signal via the antenna 102.

The transmission signal amplifier circuit 20b includes amplifiers 22b and 23b. The transmission signal amplifier circuit 20b performs operation of outputting an amplified transmission signal (third amplified transmission signal) obtained by amplifying a transmission signal (third transmission signal) based on the second communication standard. Furthermore, the reception signal amplifier circuit 50b performs operation of outputting an amplified reception signal (third amplified reception signal) obtained by amplifying a reception signal based on the first communication standard, or operation of outputting an amplified reception signal (fourth amplified reception signal) obtained by amplifying a reception signal based on the second communication standard. The other elements are similar to those included in the communication module 2a, and detailed description thereof is omitted.

In the above-described configuration, the communication unit 1b enables both the communication module 2a and the communication module 2b to simultaneously perform uplink communication based on the second communication standard. Furthermore, the communication unit 1b enables both the communication module 2a and the communication module 2b to simultaneously perform downlink communication based on at least one of the first communication standard and the second communication standard. That is, the communication unit 1b supports multiple-input and multiple-output (MIMO). On the other hand, a communication unit, according to the comparative example, causes different communication modules to perform communications based on respective different communication standards and thus does not support MIMO. That is, the communication unit 1b supports MIMO while maintaining a circuit size equivalent to that of the communication unit according to the comparative example and enables improvements in transmission rates of uplink communication based on the second communication standard, downlink communication based on the first communication standard, and downlink communication based on the second communication standard.

With respect to control of the communication unit 1b, a control IC (not illustrated) may be mounted in both of the communication module 2a and the communication module 2b. Alternatively, the control IC may be incorporated in either the communication module 2a or the communication module 2b, and the control IC incorporated in one communication module may control the other communication module.

Although FIG. 2 illustrates the configuration in which the communication module 2b amplifies a transmission signal based on the second communication standard, the communication module 2b may amplify a transmission signal based on the first communication standard in place of a transmission signal based on the second communication standard. Furthermore, as a modification of the communication unit 1b, a combination of configurations of two communication modules 2a may be provided in place of a combination of the communication modules 2a and 2b. Such a communication unit enables both of two communication modules to simultaneously perform uplink communication and downlink communication based on the first communication standard or the second communication standard. That is, the communication unit supports MIMO while maintaining a circuit size equivalent to that of the communication unit according to the comparative example and enables improvements in transmission rates of uplink communication based on the first communication standard, uplink communication based on the second communication standard, downlink communication based on the first communication standard, and downlink communication based on the second communication standard.

Third Embodiment

Figure 3:
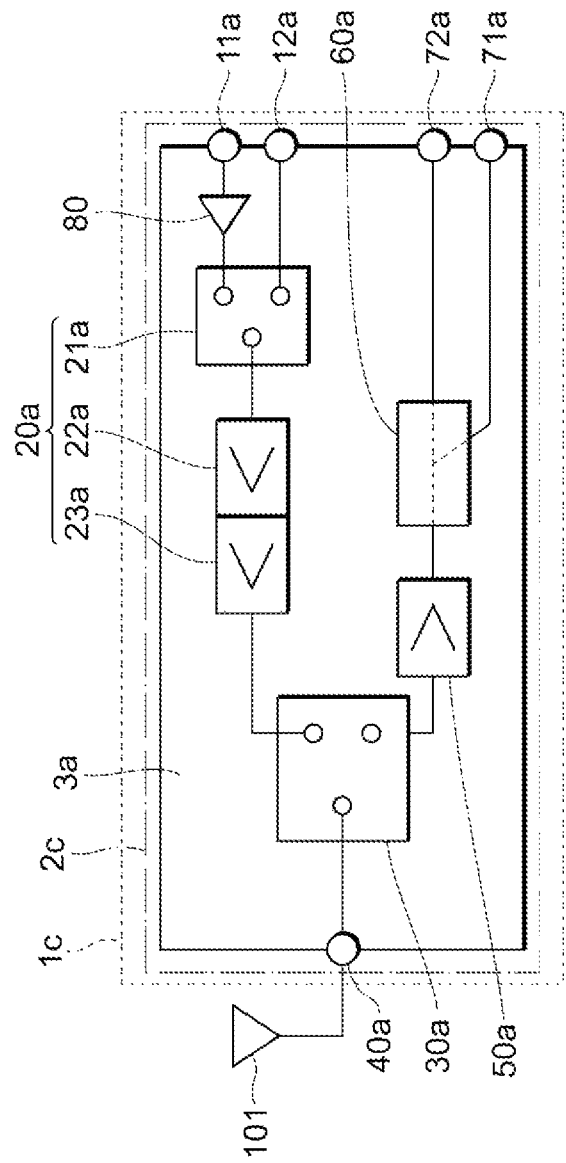
FIG. 3 illustrates an example of a circuit configuration of a communication unit according to a third embodiment.

A communication unit $1c$ according to a third embodiment will be described with reference to FIG. 3. FIG. 3 illustrates an example of a circuit configuration of the communication unit according to the third embodiment.

As illustrated in FIG. 3, the communication unit $1c$ includes a communication module $2c$. The communication module $2c$ includes an amplifier circuit 80 in addition to the elements included in the communication module $2a$ according to the first embodiment.

The amplifier circuit 80 amplifies a transmission signal (first transmission signal) input to the input terminal $11a$. The transmission signal amplifier circuit $20a$ amplifies the transmission signal amplified by the amplifier circuit 80 to generate an amplified transmission signal and outputs this amplified transmission signal. The amplifier circuit 80 is, for example, a pre-amplifier that amplifies power in a stage preceding the amplifier $22a$.

As just described, the communication unit $1c$ includes the amplifier circuit 80 that amplifies a transmission signal based on the first communication standard input to the input terminal $11a$. For this reason, for example, even if the strength of a transmission signal input to the input terminal $11a$ is lower than the strength of a transmission signal input to the input terminal $12a$, the communication unit $1c$ facilitates amplifying the strength of an amplified transmission signal to a strength necessary for communication based on each of the first communication standard and the second communication standard in comparison with the communication unit $1a$ according to the first embodiment. Thus, the communication unit $1c$ facilitates adapting the transmission signal amplifier circuit $20a$ to both uplink communication based on the first communication standard and uplink communication based on the second communication standard in comparison with the communication unit $1a$. Additionally, in the case where an output level necessary for a transmission signal based on the first communication standard and an output level necessary for a transmission signal based on the second communication standard differ from each other, the amplifier circuit 80 is not built into but is configured separately from the transmission signal amplifier circuit $20a$, thereby making it possible to stop operation of the amplifier circuit 80 as necessary in transmitting a transmission signal based on the second communication standard. Hence, the power efficiency of the communication unit $1c$ in using a transmission signal based on the second communication standard can be improved.

Although FIG. 3 illustrates the configuration in which the amplifier circuit 80 is provided on a first communication standard side, an amplifier circuit similar to the amplifier circuit 80 may be provided on a second communication standard side in place of or in addition to this configuration. Furthermore, as a modification of the communication unit $1c$, for example, a combination of the communication module $2c$ and the communication module $2b$ may be provided, or a combination of configurations of two communication modules $2c$ may be provided. Even in such a case, it is possible to support MIMO as in the communication unit $1b$ while amplifying a transmission signal to a strength necessary for communication as in the communication unit $1c$.

Fourth Embodiment

Figure 4:
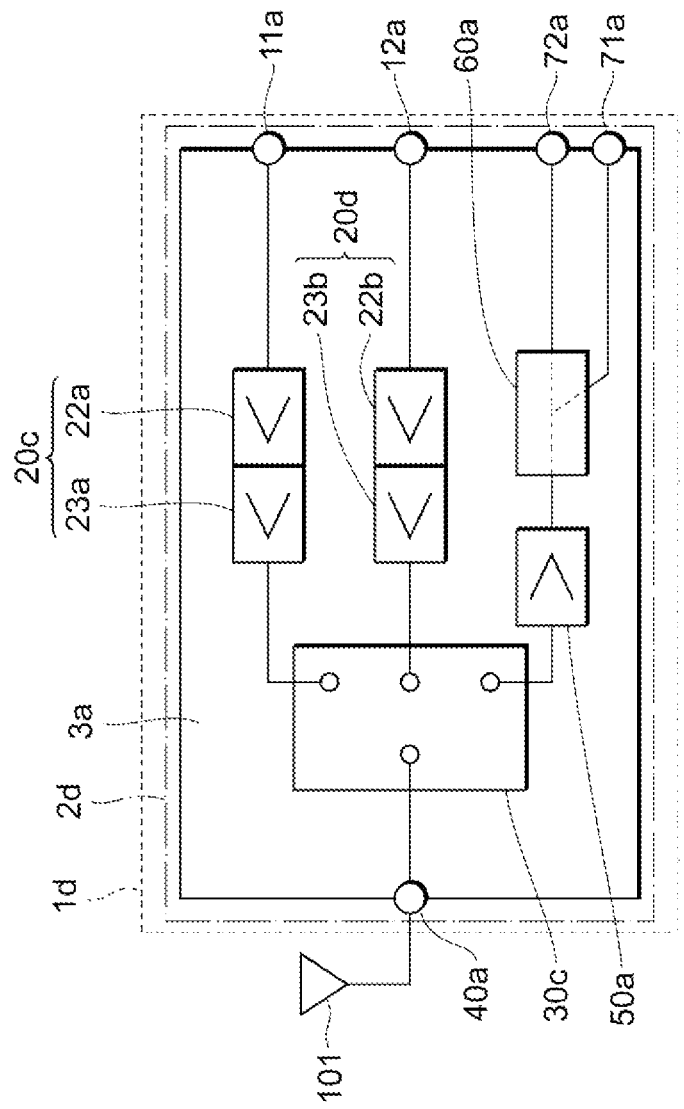
FIG. 4 illustrates an example of a circuit configuration of a communication unit according to a fourth embodiment.

A communication unit $1d$ according to a fourth embodiment will be described with reference to FIG. 4. FIG. 4 illustrates an example of a circuit configuration of the communication unit according to the fourth embodiment.

As illustrated in FIG. 4, the communication unit $1d$ includes a communication module $2d$. In comparison with the elements included in the communication module $2a$, the communication module $2d$ (first communication module) includes transmission signal amplifier circuits $20c$ and $20d$ in place of the transmission signal amplifier circuit $20a$ and includes an input-output changing switch $30c$ in place of the input-output changing switch $30a$.

The transmission signal amplifier circuit $20c$ (first transmission signal amplifier circuit) performs operation of outputting an amplified transmission signal obtained by amplifying a transmission signal based on the first communication standard. The transmission signal amplifier circuit $20d$ (second transmission signal amplifier circuit) performs operation of outputting an amplified transmission signal obtained by amplifying a transmission signal based on the second communication standard. As just described, the communication module $2d$ includes a first path that amplifies a transmission signal based on the first communication standard and a second path that amplifies a transmission signal based on the second communication standard. Hence, the transmission signal amplifier circuit $20c$ and the transmission signal amplifier circuit $20d$ do not include an element corresponding to the switch $21a$ illustrated in FIG. 1.

The input-output changing switch $30c$ switches among a state in which an output of the transmission signal amplifier circuit $20c$ and the input-output terminal $40a$ are electrically connected to each other, a state in which an output of the transmission signal amplifier circuit $20d$ and the input-output terminal $40a$ are electrically connected to each other, and a state in which the input-output terminal $40a$ and the input of the reception signal amplifier circuit $50a$ are electrically connected to each other. Thus, the input-output changing switch $30c$ switches among the case where an amplified transmission signal output from the transmission signal amplifier circuit $20c$ is output from the input-output terminal $40a$, the case where an amplified transmission signal output from the transmission signal amplifier circuit $20d$ is output from the input-output terminal $40a$, and the case where a reception signal received at the input-output terminal $40a$ is input to the reception signal amplifier circuit $50a$.

As just described, in the communication unit $1d$, transmission signals are amplified by the different transmission signal amplifier circuits provided for the respective communication standards, and a reception signal is amplified by the one reception signal amplifier circuit. Thus, in comparison with the communication unit according to the comparative example, the communication unit $1d$ makes it possible to achieve communications based on different communication standards while curbing an increase in circuit size.

As a modification of the communication unit $1d$, for example, a combination of the communication module $2d$ and the communication module $2b$ may be provided, or a combination of configurations of two communication modules 2d may be provided. In these cases, it is possible to support MIMO as in the communication unit 1b.

Fifth Embodiment

Figure 5:
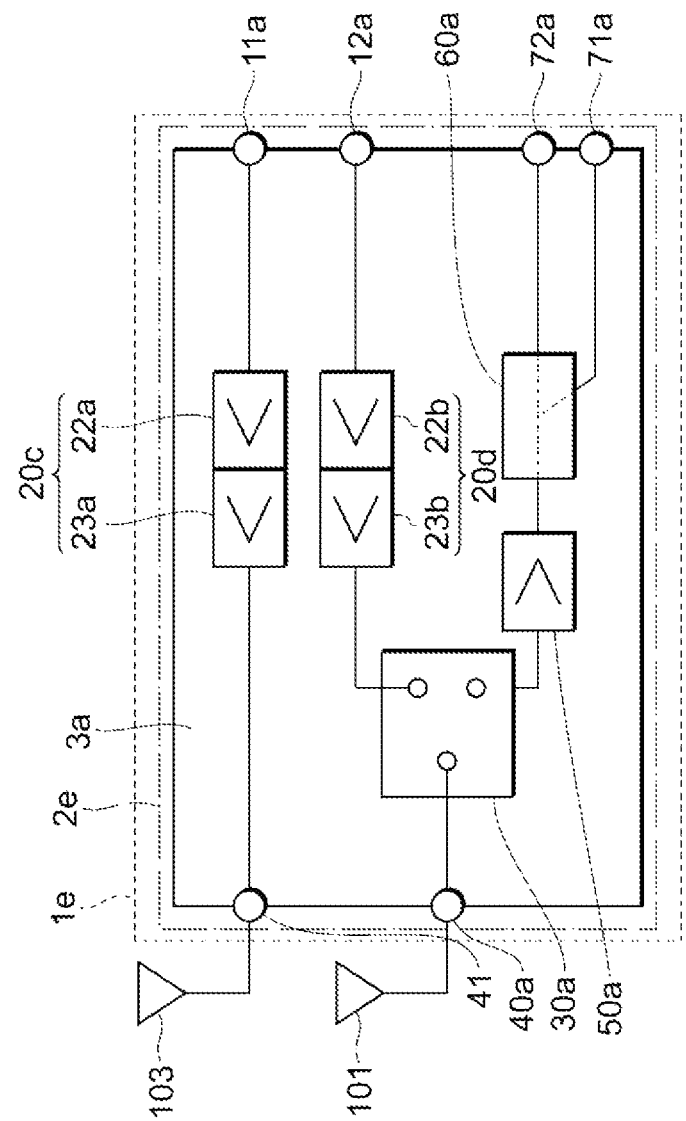
FIG. 5 illustrates an example of a circuit configuration of a communication unit according to a fifth embodiment.

A communication unit 1e according to a fifth embodiment will be described with reference to FIG. 5. FIG. 5 illustrates an example of a circuit configuration of the communication unit according to the fifth embodiment.

As illustrated in FIG. 5, the communication unit 1e includes a communication module 2e. In comparison with the communication module 2d, the communication module 2e includes the input-output changing switch 30a in place of the input-output changing switch 30c, and further includes an output terminal 41.

The output terminal 41 outputs an amplified transmission signal output from the transmission signal amplifier circuit 20c to an antenna 103. That is, in the communication unit 1e, a transmission signal based on the first communication standard is output from the output terminal 41 based on a communication standard different from the second communication standard without necessarily passing through the input-output changing switch 30a.

In such a configuration as well, in comparison with the communication unit according to the comparative example, the communication unit 1e makes it possible to achieve communications based on different communication standards while curbing an increase in circuit size.

Sixth Embodiment

Figure 6:
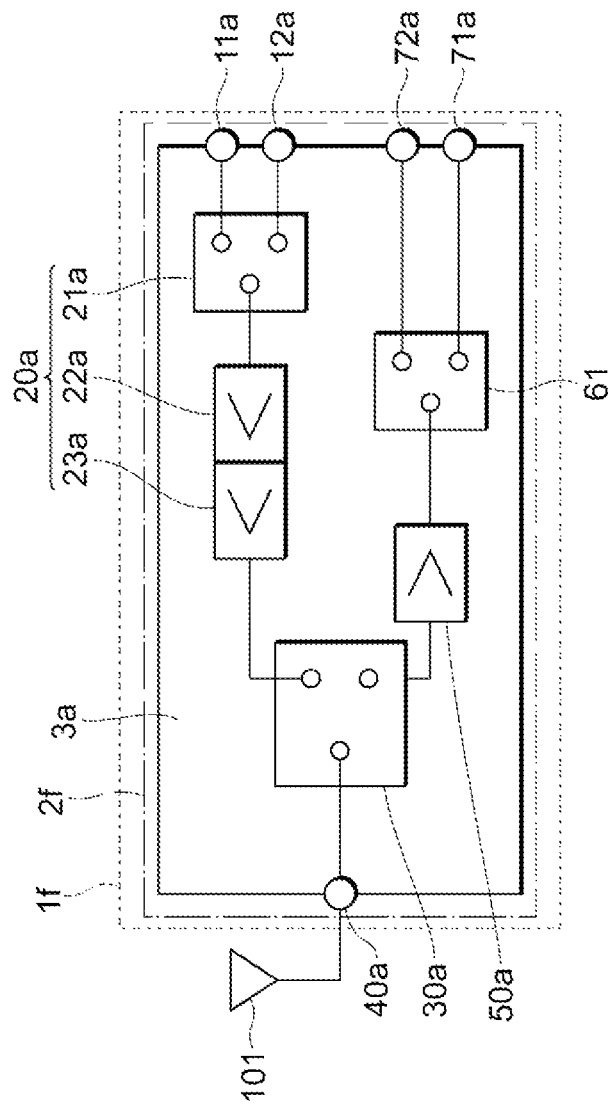
FIG. 6 illustrates an example of a circuit configuration of a communication unit according to a sixth embodiment.

A communication unit 1f according to a sixth embodiment will be described with reference to FIG. 6. FIG. 6 illustrates an example of a circuit configuration of the communication unit according to the sixth embodiment.

As illustrated in FIG. 6, the communication unit 1f includes a communication module 2f. The communication module 2f includes a switch 61 in place of the divider 60a included in the communication module 2a according to the first embodiment.

The switch 61 switches between a state in which an output of the reception signal amplifier circuit 50a and the output terminal 71a are electrically connected to each other and a state in which the output of the reception signal amplifier circuit 50a and the output terminal 72a are electrically connected to each other. Thus, the switch 61 switches between the cases where an amplified reception signal based on the first communication standard is output to the output terminal 71a and the case where an amplified reception signal based on the second communication standard is output to the output terminal 72a.

As just described, reception signals may be divided between the different output terminals 71a and 72a according to a communication standard by the switch 61 instead of being distributed to the two output terminals 71a and 72a by the divider 60a. In such a configuration as well, in comparison with the communication unit according to the comparative example, the communication unit 1f makes it possible to achieve communications based on different communication standards while curbing an increase in circuit size as in the communication unit 1a.

Seventh Embodiment

Figure 7A:
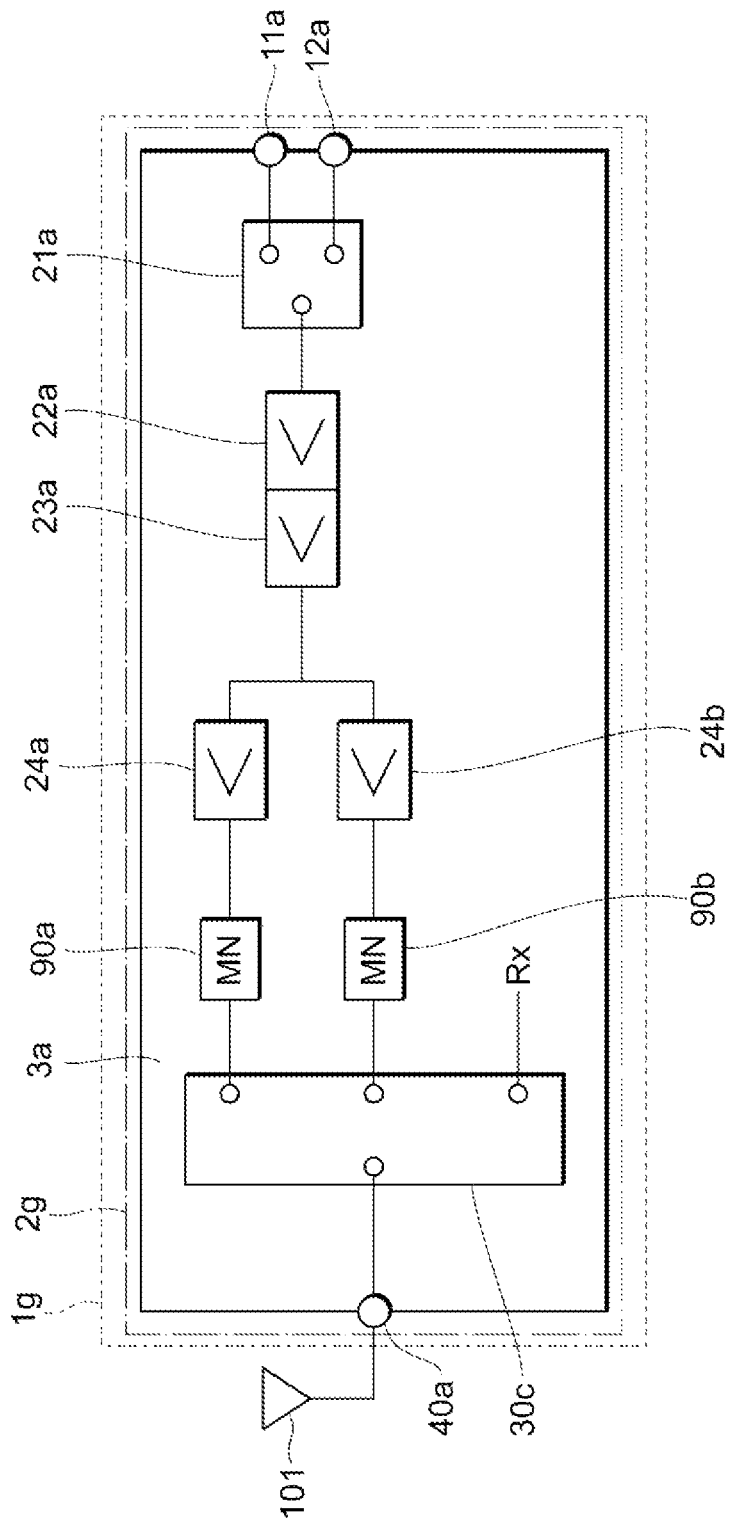
FIG. 7A illustrates an example of a circuit configuration of a communication unit according to a seventh embodiment.

Communication units 1g to 1i according to a seventh embodiment and modifications of the seventh embodiment will be described with reference to FIGS. 7A to 7C. FIG. 7A illustrates an example of a circuit configuration of the communication unit according to the seventh embodiment.

As illustrated in FIG. 7A, the communication unit 1g includes a communication module 2g. In comparison with the elements included in the communication module 2a, the communication module 2g further includes amplifiers 24a and 24b, and matching networks (MNs) 90a and 90b, and includes the input-output changing switch 30c in place of the input-output changing switch 30a. In the following embodiments, as a path of reception signals, a path in any of the above-described embodiments can be used. Thus, the path of reception signals is represented by Rx in the drawings, and description thereof is omitted.

The amplifier 24a (first amplifier) and the amplifier 24b (second amplifier) are connected in parallel in a stage subsequent to the amplifier 23a and constitute respective third-stage amplifiers of the first path and the second path into which division has been made. That is, in the communication module 2g, a transmission signal based on the first communication standard is amplified by the amplifiers 22a, 23a, and 24a in sequence, and a transmission signal based on the second communication standard is amplified by the amplifiers 22a, 23a, and 24b in sequence. Specifically, for example, when a signal based on the first communication standard is supplied, the amplifier 24a is turned on, and the amplifier 24b is turned off. When a signal based on the second communication standard is supplied, the amplifier 24a is turned off, and the amplifier 24b is turned on.

The matching networks 90a and 90b are respectively provided between the amplifier 24a and the input-output changing switch 30c and between the amplifier 24b and the input-output changing switch 30c. The matching networks 90a and 90b match impedances of the amplifiers 24a and 24b and preceding stages to an impedance of the input-output changing switch 30c and subsequent stages.

As just described, the communication unit 1g includes the amplifiers 24a and 24b corresponding to the respective communication standards in a third stage. Thus, for example, even if a necessary signal strength differs between the first communication standard and the second communication standard, amplifiers appropriate to respective strengths can be designed. Hence, the communication unit 1g enables an improvement in linearity in comparison with a configuration in which all amplifiers are shared between different communication standards.

Figure 7B:
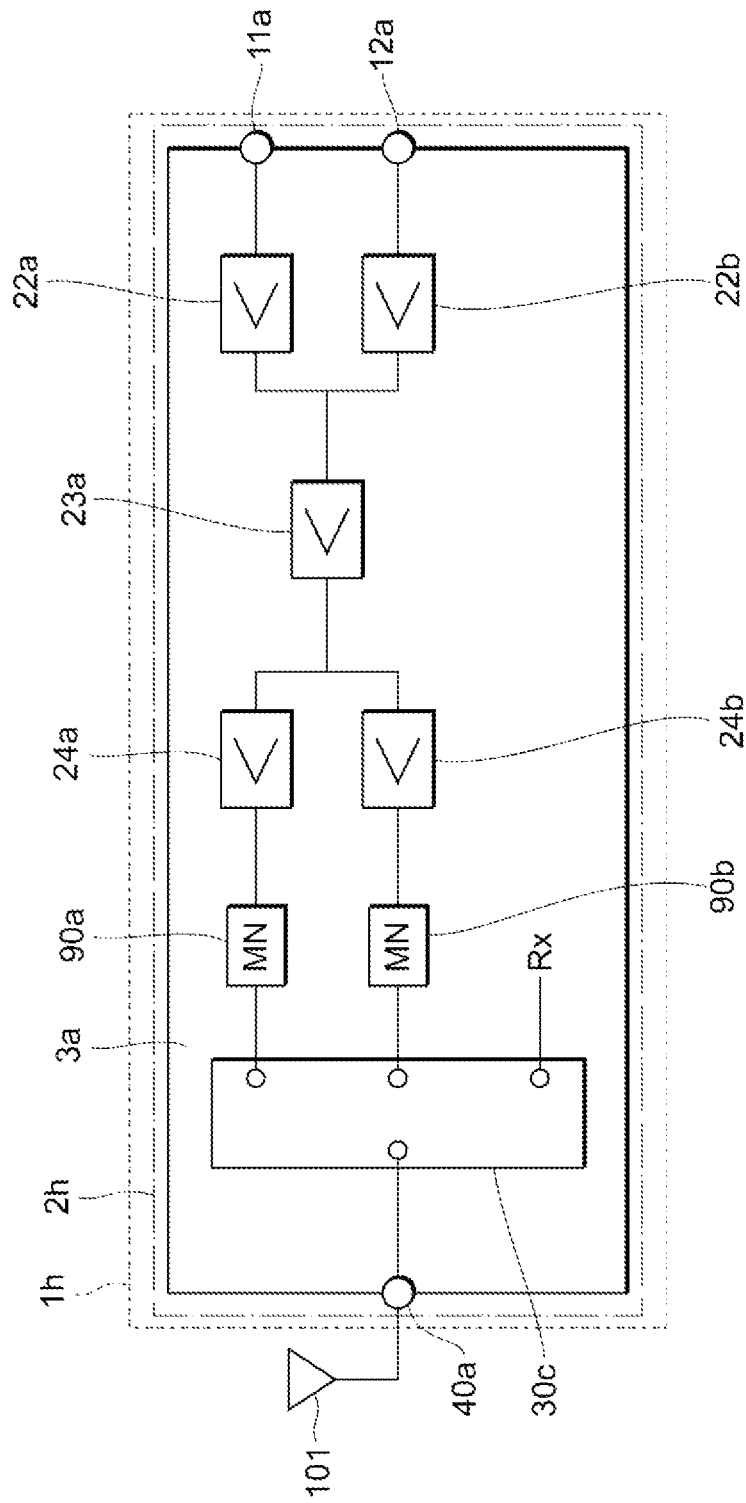
FIG. 7B illustrates an example of a circuit configuration of a communication unit according to a modification of the seventh embodiment.

FIG. 7B illustrates an example of a circuit configuration of the communication unit according to a modification of the seventh embodiment.

As illustrated in FIG. 7B, the communication unit 1h includes a communication module 2h. In comparison with the elements included in the communication module 2g illustrated in FIG. 7A, the communication module 2h does not include the switch 21a and further includes the amplifier 22b.

The amplifiers 22a and 22b are provided in a stage subsequent to the input terminals 11a and 12a and constitute respective first-stage amplifiers of the first path and the second path. That is, in the communication module 2h, a transmission signal based on the first communication standard is amplified by the amplifiers 22a, 23a, and 24a in sequence. On the other hand, a transmission signal based on the second communication standard is amplified by the amplifiers 22b, 23a, and 24b in sequence.

As just described, a stage where amplifiers of the first path and the second path into which division has been made are located is not limited to the third stage, and the stage or stages may be any one or two of the first, second, and third stages.

Figure 7C:
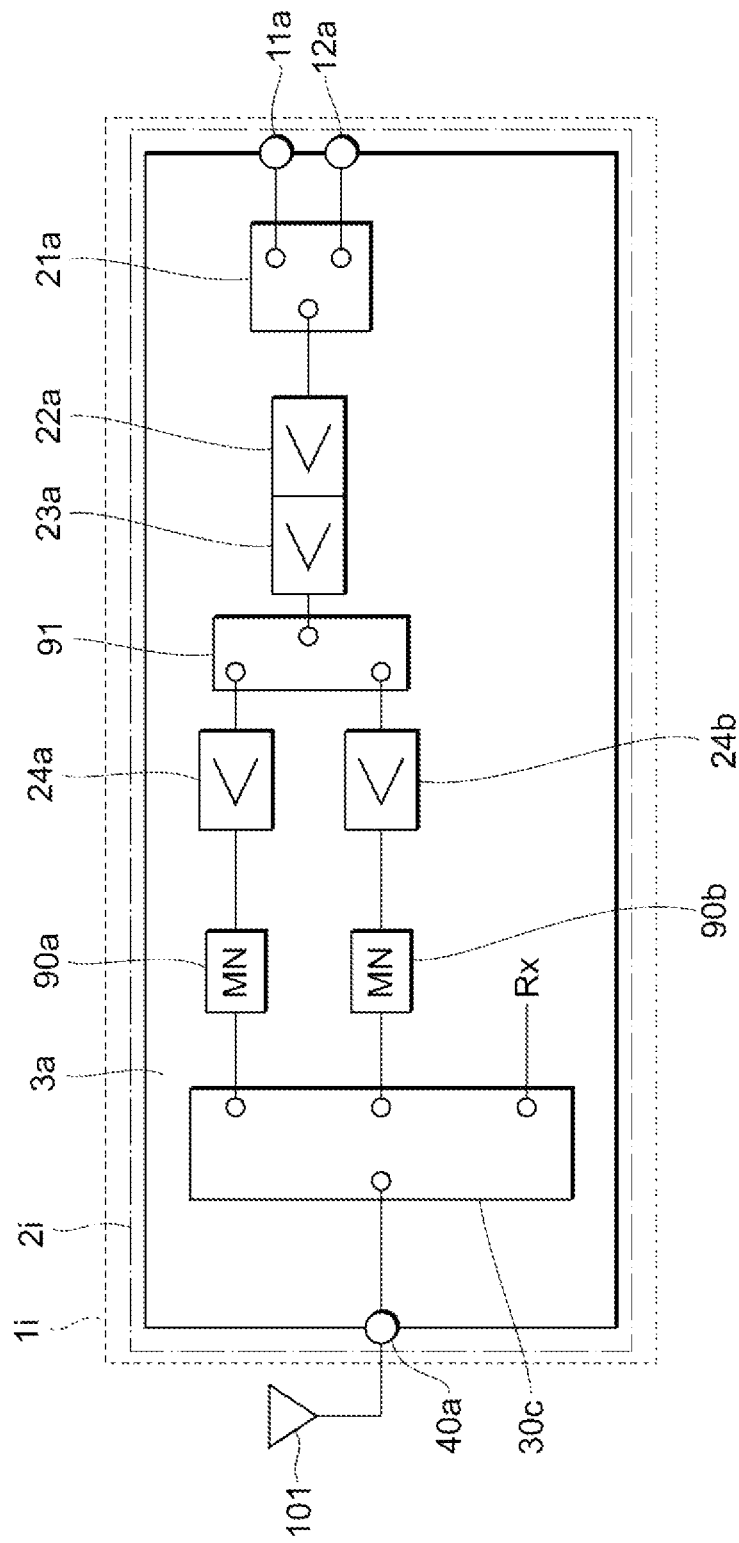
FIG. 7C illustrates an example of a circuit configuration of a communication unit according to another modification of the seventh embodiment.

FIG. 7C illustrates an example of a circuit configuration of the communication unit according to another modification of the seventh embodiment.

As illustrated in FIG. 7C, the communication unit 1*i* includes a communication module 2*i*. In comparison with the elements included in the communication module 2*g* illustrated in FIG. 7A, the communication module 2*i* further includes a switch 91.

The switch 91 performs switching to supply a transmission signal based on the first communication standard from the amplifier 23*a* to the amplifier 24*a* and to supply a transmission signal based on the second communication standard from the amplifier 23*a* to the amplifier 24*b*.

As just described, a switch may be used for division into the first path and the second path. The use of the switch readily ensures isolation between the paths in comparison with a configuration in which the paths are directly connected.

Although FIGS. 7A to 7C each illustrate the example where the matching networks are provided in the respective first and second paths, one matching network may be shared between the first path and the second path. In this case, the one matching network may be a variable matching network whose parameters can be controlled in accordance with a communication standard on which a supplied signal is based. Furthermore, in the case where one amplifier is shared in a final stage, division may be made from the shared amplifier into two paths, and the matching networks may be provided in the respective branch paths. In this case, switching between the matching networks to which a signal is to be supplied may be performed by a switch.

Furthermore, although FIGS. 7A to 7C each illustrate the example where three stages of amplifiers are included, the number of amplifier stages included in the communication module is not limited to three and may be one, two, or four or more. These modifications are similarly applicable to the other embodiments.

Eighth Embodiment

Figure 8:
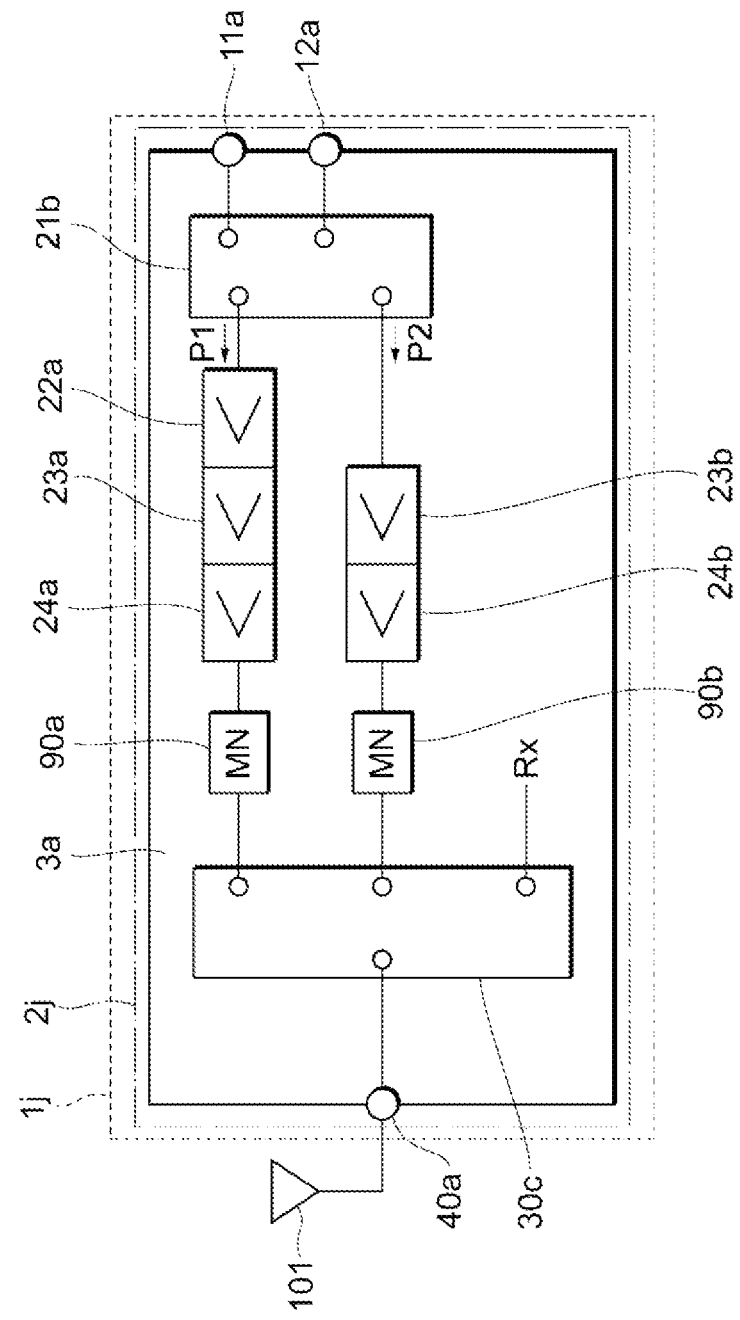
FIG. 8 illustrates an example of a circuit configuration of a communication unit according to an eighth embodiment.

A communication unit 1*j* according to an eighth embodiment will be described with reference to FIG. 8. FIG. 8 illustrates an example of a circuit configuration of the communication unit according to the eighth embodiment.

The communication unit 1*j* operates in different modes according to a signal strength necessary as a transmission signal. As illustrated in FIG. 8, the communication unit 1*j* includes a communication module 2*j*.

The communication module 2*j* includes two paths, and a switch 21*b* that switches between destinations to which a signal is supplied. One path (first path) P1 includes three amplifiers 22*a* to 24*a*, and the other path (second path) P2 includes two amplifiers 23*b* and 24*b*.

In the communication module 2*j*, when a signal based on the second communication standard is input from the input terminal 11*a*, the signal is supplied to the path P1 by the switch 21*b*. On the other hand, when a signal based on the first communication standard is input from the input terminal 12*a*, the signal is supplied to a path different according to a necessary signal strength. Specifically, when a necessary signal strength is greater than a predetermined level, the communication unit 1*j* operates in a high power mode (first mode). In this case, the switch 21*b* supplies the signal to the path P1. Thus, the signal is amplified by three stages of amplifiers 22*a* to 24*a*. On the other hand, when a necessary signal strength is less than the predetermined level, the communication unit 1*j* operates in a low power mode (second mode). In this case, the switch 21*b* supplies the signal to the path P2. Thus, the signal is amplified by two stages of amplifiers 23*b* and 24*b*.

As just described, in the communication unit 1*j*, the paths are switched in accordance with an operation mode, thereby enabling an improvement in linearity in comparison with the communication unit 1*a*, for example. In particular, eLAA is wider in dynamic range demanded (for example, about −50 to 30 dBm) than a wireless LAN, and it is difficult for a transmission circuit (not illustrated) that generates a transmission signal to ensure a sufficient dynamic range. Thus, when paths for eLAA are switched in accordance with an operation mode, a demand for linearity can be satisfied while ensuring a wide dynamic range. Note that a configuration in which paths for a wireless LAN are switched is not intended to be eliminated, and the configuration in which paths for a wireless LAN are switched in place of paths for eLAA may be employed.

Furthermore, although the example is given where, in the communication unit 1*j*, the path P1 and the path P2 respectively include three stages of amplifiers and two stages of amplifiers, the number of amplifiers included in each path is not limited to this.

Ninth Embodiment

Figure 9A:
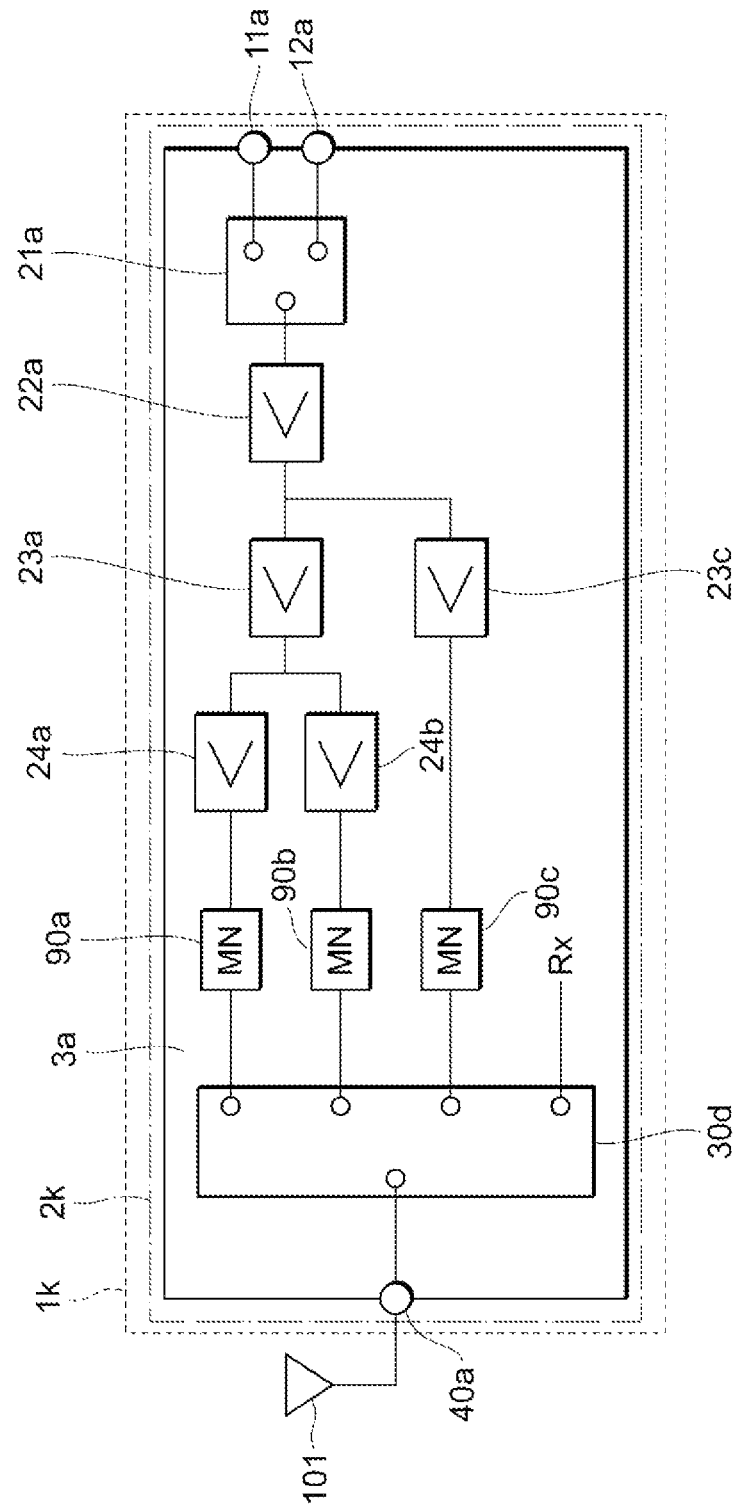
FIG. 9A illustrates an example of a circuit configuration of a communication unit according to a ninth embodiment.

Communication units 1*k* and 1*l* according to a ninth embodiment and a modification of the ninth embodiment will be described with reference to FIGS. 9A and 9B. FIG. 9A illustrates an example of a circuit configuration of the communication unit according to the ninth embodiment.

As illustrated in FIG. 9A, the communication unit 1*k* includes a communication module 2*k*. In comparison with the elements included in the communication module 2*g* illustrated in FIG. 7A, the communication module 2*k* further includes an amplifier 23*c* and a matching network 90*c* and includes an input-output changing switch 30*d* in place of the input-output changing switch 30*c*.

Specifically, in the communication module 2*k*, there is provided a path that branches off between the first-stage amplifier 22*a* and the second-stage amplifier 23*a* and extends from the amplifier 23*c* to the input-output changing switch 30*d* through the matching network 90*c*. For example, when a signal based on the first communication standard is input from the input terminal 11*a*, the signal is amplified by the amplifiers 22*a*, 23*a*, and 24*a* in sequence, and supplied to the matching network 90*a*. On the other hand, when a signal based on the second communication standard is input from the input terminal 12*a* and when the communication unit 1*k* operates in the high power mode, the signal is amplified by the amplifiers 22*a*, 23*a*, and 24*b* in sequence, and supplied to the matching network 90*b*. Furthermore, when a signal based on the second communication standard is input from the input terminal 12*a* and when the communication unit 1*k* operates in the low power mode, the signal is amplified by the amplifiers 22*a* and 23*c* in sequence and supplied to the matching network 90*c*.

As just described, the communication unit 1*k* includes the different amplifiers 24*a* and 24*b* in the third stage, thereby making it possible to design an amplifier appropriate to each communication standard in the case where saturation output power differs greatly between the first communication standard and the second communication standard, for example. Furthermore, no switch is used for division into paths extending to the second stage and division into paths extending to the third stage, thereby making it possible to reduce signal degradation in comparison with a configuration in which a switch is used.

FIG. 9B illustrates an example of a circuit configuration of the communication unit according to the modification of the ninth embodiment.

As illustrated in FIG. 9B, the communication unit 11 includes a communication module 2*l*. In comparison with the elements included in the communication module 2*k* illustrated in FIG. 9A, the communication module 2*l* further includes amplifiers 22*b* and 24*c*.

Specifically, in the communication module 2*l*, division is made into the first-stage amplifiers 22*a* and 22*b*, and a path for the low power mode in the second communication standard branches off on an input terminal 12*a* side with respect to the first-stage amplifier 22*b*. For example, when a signal based on the first communication standard is input from the input terminal 11*a*, the signal is amplified by the amplifiers 22*a*, 23*a*, and 24*a* in sequence, and supplied to the matching network 90*a*. On the other hand, when a signal based on the second communication standard is input from the input terminal 12*a* and when the communication unit 11 operates in the high power mode, the signal is amplified by the amplifiers 22*b*, 23*a*, and 24*b* in sequence, and supplied to the matching network 90*b*. Furthermore, when a signal based on the second communication standard is input from the input terminal 12*a* and when the communication unit 11 operates in the low power mode, the signal is amplified by the amplifiers 23*c* and 24*c* in sequence instead of being supplied to the amplifier 22*b* and is supplied to the matching network 90*c*.

As just described, paths for the first communication standard and the high power mode in the second communication standard may branch off at any of the first, second, and third stages. Furthermore, a location at which the path for the low power mode in the second communication standard branches off may be a location between the first and second stages or a location between the second and third stages or may be a location between the input terminal 12*a* and the first-stage amplifier 22*b* as illustrated in FIG. 9B.

In the communication units 1*k* and 1*l*, the number of amplifier stages included in each path is not limited to two or three. For example, the communication unit 1*k* does not have to include the amplifier 23*c*, and the communication unit 11 does not have to include the amplifier 23*c* or the amplifier 24*c*.

Tenth Embodiment

Figure 10:
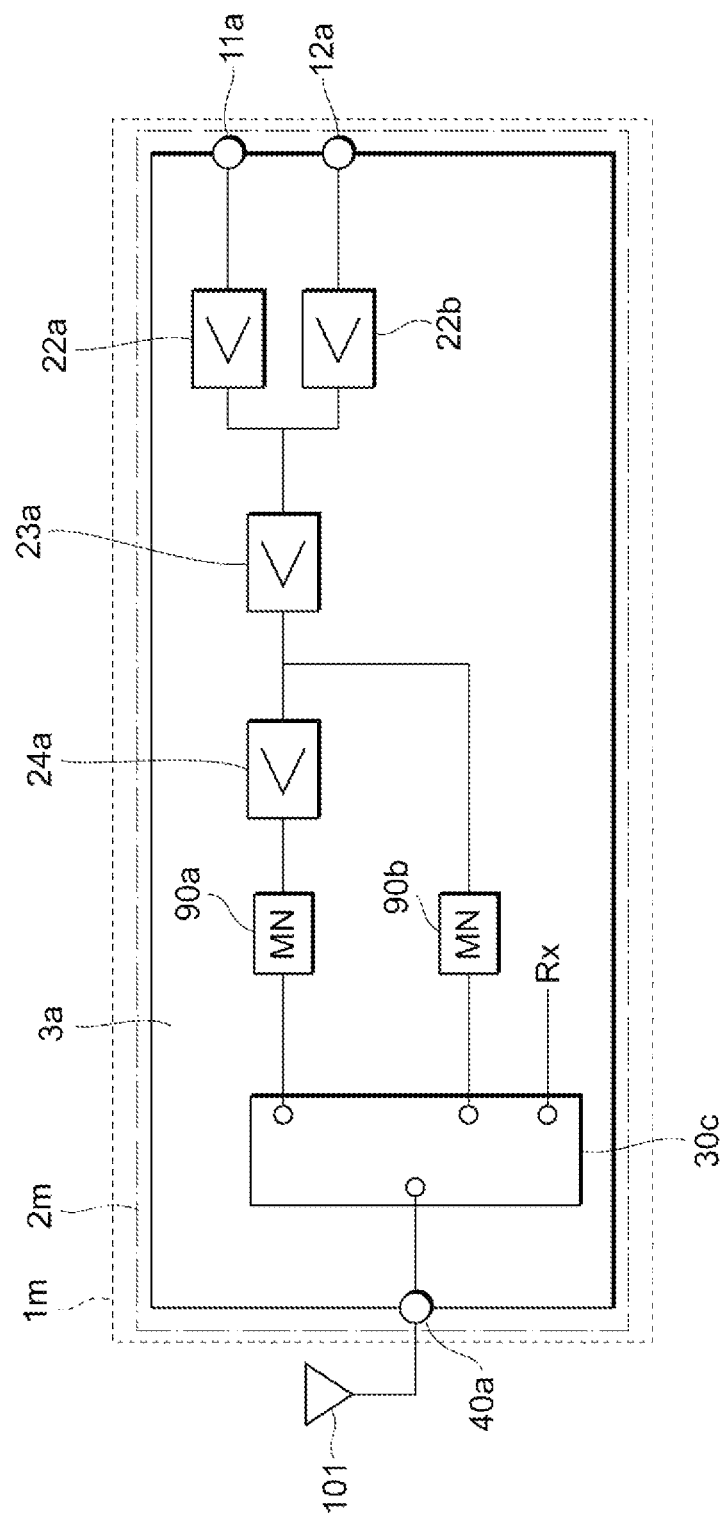
FIG. 10 illustrates an example of a circuit configuration of a communication unit according to a tenth embodiment.

FIG. 10 illustrates an example of a circuit configuration of a communication unit according to a tenth embodiment.

As illustrated in FIG. 10, a communication unit 1*m* includes a communication module 2*m*. In comparison with the elements included in the communication module 2*h* illustrated in FIG. 7B, the communication module 2*m* does not include the amplifier 24*b*.

That is, in the communication module 2*m*, when a signal based on the second communication standard is input from the input terminal 12*a* and when the communication unit 1*m* operates in the low power mode, the signal is amplified by the amplifiers 22*b* and 23*a*, and then supplied to the matching network 90*b* without necessarily passing through any third-stage amplifier.

Furthermore, the communication unit 1*m* include no switch between the input terminals 11*a* and 12*a* and the first-stage amplifiers 22*a* and 22*b*. Because of this, for example, the amplifiers 22*a*, 22*b*, 23*a*, and 24*a* composed of heterojunction bipolar transistors (HBTs) can be formed on a single chip. On a chip different from this, the input-output changing switch 30*c* can be composed of a field-effect transistor, such as a metal-oxide-semiconductor field-effect transistor (MOSFET) or high electron mobility transistor (HEMT). Thus, for example, in comparison with a configuration in which amplifiers and a switch are formed on a single chip by using, for example, a bipolar FET (BiFET) or bipolar HEMT (BiHEMT) technology, the communication unit 1*m* having a simple configuration can be manufactured, and manufacturing costs can be reduced. The same holds true for the above-described communication units 1*d*, 1*e*, 1*h*, and 1*l*, for example.

The above-described embodiments are intended to facilitate understanding of the present disclosure but not intended for limited interpretation of the present disclosure. The present disclosure can be changed or improved without departing from the gist of thereof and includes equivalents thereof. That is, things obtained by those skilled in the art making appropriate design changes to the embodiments are also included in the scope of the present disclosure as long as the things have features of the present disclosure. For example, the elements included in the embodiments, and the arrangements, materials, conditions, shapes, sizes, and the like of the elements are not limited to those exemplified in the embodiments, and can be appropriately changed. Furthermore, the embodiments are merely illustrative, and it goes without saying that configurations described in different embodiments can be partially replaced or combined. Such replacement and such combination are also included in the scope of the present disclosure as long as the replacement and the combination have features of the present disclosure. For example, the number of stages in each transmission signal amplifier circuit is not limited to two and may be one, or three or more.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. A communication unit comprising:
a first communication module comprising:
a first input terminal to which a first transmission signal based on a first communication standard is input;
a first transmission signal amplifier circuit configured to amplify the first transmission signal and output a first amplified transmission signal;
a second input terminal to which a second transmission signal based on a second communication standard is input, the second communication standard being different from the first communication standard;
a second transmission signal amplifier circuit configured to amplify the second transmission signal and output a second amplified transmission signal;
a first input-output terminal configured to output the first amplified transmission signal or the second amplified transmission signal, and receive at least one of a first reception signal based on the first communication standard and a second reception signal based on the second communication standard;
a first reception signal amplifier circuit configured to amplify the first reception signal and output a first amplified reception signal, or amplify the second reception signal and output a second amplified reception signal obtained;
a first output terminal configured to output the first amplified reception signal; and
a second output terminal configured to output the second amplified reception signal a second communication module comprising: a third input terminal to which a third transmission signal based on the second communication standard is input; a second transmission signal amplifier circuit configured to amplify the third transmission signal and output a third amplified transmission signal; a second input-output terminal configured to output the third amplified transmission signal, and receive at least one of a third reception signal based on the first communication standard and a fourth reception signal based on the second communication standard; a second reception signal amplifier circuit configured to amplify the third reception signal and output a third amplified reception signal, or amplify the fourth reception signal and output a fourth amplified reception signal; a third output terminal configured to output the third amplified reception signal; and a fourth output terminal configured to output the fourth amplified reception signal.

2. The communication unit according to claim 1, wherein the first communication module further comprises an output terminal configured to output the first amplified transmission signal.

3. The communication unit according to claim 1, wherein the communication unit supports multiple-input and multiple-output (MIMO) operation.

* * * * *

UNITED STATES PATENT AND TRADEMARK OFFICE
CERTIFICATE OF CORRECTION

PATENT NO. : 10,454,434 B2
APPLICATION NO. : 16/038770
DATED : October 22, 2019
INVENTOR(S) : Tsuyoshi Sato Page 1 of 1

It is certified that error appears in the above-identified patent and that said Letters Patent is hereby corrected as shown below:

In the Specification

Column 9, Line 32, "unit if" should read -- unit 1f --

Column 9, Line 36, "unit if" should read -- unit 1f --

Column 9, Line 58, "unit if" should read -- unit 1f --

Signed and Sealed this
Sixth Day of October, 2020

Andrei Iancu
*Director of the United States Patent and Trademark Office*